US012623316B2

(12) United States Patent
Suzuki et al.

(10) Patent No.: US 12,623,316 B2
(45) Date of Patent: May 12, 2026

(54) CHEMICAL MECHANICAL POLISHING SYSTEM FOR A WORKPIECE, ARITHMETIC SYSTEM, AND METHOD OF PRODUCING SIMULATION MODEL FOR CHEMICAL MECHANICAL POLISHING

(71) Applicants: EBARA CORPORATION, Tokyo (JP); NATIONAL UNIVERSITY CORPORATION TOKAI NATIONAL HIGHER EDUCATION AND RESEARCH SYSTEM, Aichi (JP); NATIONAL UNIVERSITY CORPORATION KANAZAWA UNIVERSITY, Ishikawa (JP)

(72) Inventors: Norikazu Suzuki, Aichi (JP); Hozumi Yasuda, Tokyo (JP); Yoshihiro Mochizuki, Tokyo (JP); Yohei Hashimoto, Ishikawa (JP)

(73) Assignees: EBARA CORPORATION, Tokyo (JP); NATIONAL UNIVERSITY CORPORATION TOKAI NATIONAL HIGHER EDUCATION AND RESEARCH SYSTEM, Aichi (JP); NATIONAL UNIVERSITY CORPORATION KANAZAWA UNIVERSITY, Ishikawa (JP)

( * ) Notice: Subject to any disclaimer, the term of this patent is extended or adjusted under 35 U.S.C. 154(b) by 491 days.

(21) Appl. No.: 17/911,947

(22) PCT Filed: Mar. 10, 2021

(86) PCT No.: PCT/JP2021/009516
§ 371 (c)(1),
(2) Date: Sep. 15, 2022

(87) PCT Pub. No.: WO2021/193063
PCT Pub. Date: Sep. 30, 2021

(65) Prior Publication Data
US 2023/0043639 A1 Feb. 9, 2023

(30) Foreign Application Priority Data
Mar. 24, 2020 (JP) ................................. 2020-052046

(51) Int. Cl.
| | | |
|---|---|---|
| *H01L 21/304* | (2006.01) | |
| *B24B 37/005* | (2012.01) | |
| *B24B 53/017* | (2012.01) | |

(52) U.S. Cl.
CPC .......... *B24B 37/005* (2013.01); *B24B 53/017* (2013.01); *H01L 21/304* (2013.01)

(58) Field of Classification Search
CPC ... B24B 37/042; B24B 37/005; B24B 37/013; B24B 49/16; B24B 49/006; B24B 49/10;
(Continued)

(56) References Cited

U.S. PATENT DOCUMENTS

| | | |
|---|---|---|
| 2005/0197046 A1 | 9/2005 | Aoyagi et al. |
| 2015/0255357 A1 | 9/2015 | Kobayashi et al. |
| 2016/0184961 A1* | 6/2016 | Shinozaki ............. B24B 37/107 451/5 |

FOREIGN PATENT DOCUMENTS

| | | | | |
|---|---|---|---|---|
| CN | 1524027 A | * | 8/2004 | ........... B24B 37/005 |
| CN | 1674234 A | | 9/2005 | |
(Continued)

OTHER PUBLICATIONS

International Patent Application No. PCT/JP2021/009516; Int'l Search Report; dated May 11, 2021; 4 pages.

*Primary Examiner* — Rehana Perveen
*Assistant Examiner* — Cuong V Luu
(74) *Attorney, Agent, or Firm* — BakerHostetler

(57) ABSTRACT

The present invention relates to a cyber-physical system for optimizing a simulation model for chemical mechanical polishing based on actual measurement data of chemical mechanical polishing. The chemical mechanical polishing system includes a polishing apparatus (1) for polishing the workpiece (W) and an arithmetic system (47). The arithmetic system (47) includes a simulation model including at least a physical model configured to output an estimated polishing physical quantity including an estimated polishing rate of the workpiece (W). The arithmetic system (47) is configured to: input polishing conditions for the workpiece (W) into the simulation model; output the estimated polishing physical quantity of the workpiece (W) from the simulation model; and determine model parameters of the simu- (Continued)

lation model that bring the estimated polishing physical quantity closer to a measured polishing physical quantity of the workpiece (W).

4 Claims, 8 Drawing Sheets

(58) Field of Classification Search
CPC ....... B24B 51/00; B24B 49/18; B24B 49/183; B24B 49/186; B24B 53/017; H01L 21/304; H01L 21/67092
USPC ...................................................... 451/5, 41
See application file for complete search history.

(56) References Cited

FOREIGN PATENT DOCUMENTS

| | | | | |
|---|---|---|---|---|
| CN | 102390036 | A | * | 3/2012 |
| CN | 104002239 | A | | 8/2014 |
| JP | 2010-087135 | A | | 4/2010 |
| JP | 2011148036 | A | * | 8/2011 |
| JP | 2012-056029 | A | | 3/2012 |
| JP | 2012-074574 | A | | 4/2012 |
| JP | 2013118404 | A | * | 6/2013 |
| JP | 2016-124063 | A | | 7/2016 |

* cited by examiner

FIG. 7

CHEMICAL MECHANICAL POLISHING SYSTEM FOR A WORKPIECE, ARITHMETIC SYSTEM, AND METHOD OF PRODUCING SIMULATION MODEL FOR CHEMICAL MECHANICAL POLISHING

TECHNICAL FIELD

The present invention relates to a chemical mechanical polishing system for polishing a surface of a workpieces, such as wafer, substrate, or panel, and particularly relates to a cyber-physical system that optimizes a simulation model for chemical mechanical polishing based on actual measurement data of chemical mechanical polishing.

BACKGROUND ART

In manufacturing of semiconductor devices, various types of films are formed on a wafer. After the film forming process, the wafer is polished in order to remove unnecessary parts of the film and surface irregularities. Chemical mechanical polishing (CMP) is a typical technique for the wafer polishing. CMP is performed by rubbing the wafer against a polishing surface while supplying slurry onto the polishing surface. A film that forms the surface of the wafer is polished by a combination of a chemical action of the slurry and a mechanical action of abrasive grains contained in the slurry.

Simulation techniques for wafer polishing have been developed for the purpose of estimating a film thickness of a wafer and detecting an end point of wafer polishing. Machine learning, such as deep learning, is a typical technique for polishing simulation. For example, a model constituted of a neural network is created by machine learning, and polishing conditions for a wafer are input into the model, so that an estimated value of a polishing result is output from the model. Polishing estimation by such machine learning is expected as a technique capable of obtaining an estimation result closer to actual polishing.

CITATION LIST

Patent Literature

Patent document 1: Japanese laid-open patent publication No. 2012-74574

SUMMARY OF INVENTION

Technical Problem

However, a large amount of training data (so-called big data) is required for the operations of producing a model by the machine learning. In particular, in order to create a model that can output more accurate polishing result, a larger amount of data is required. As a result, it takes a long time to create the model. Furthermore, since the model itself has a complicated structure, it takes a relatively long time for the model to output the polishing result.

In addition, the model constituted of the neural network is a so-called black box, and it is unknown what structure it has (or what weight parameters it has). Therefore, if an actual polishing result and the polishing result output from the model are different, it is impossible to identify a part to be corrected in the model. In order to correct the model, additional training data is required and it takes a long time to correct the model.

Therefore, the present invention provides a chemical mechanical polishing system and an arithmetic system capable of accurately and quickly estimate a result of polishing of a workpiece, such as a wafer, by using a physical model. The present invention also relates to a method of producing a simulation model for chemical mechanical polishing.

Solution to Problem

In an embodiment, there is provided a chemical mechanical polishing system comprising: a polishing table configured to support a polishing pad having a polishing surface; a polishing head configured to press a workpiece against the polishing surface; a slurry supply nozzle configured to supply slurry onto the polishing surface; and an arithmetic system having a memory storing therein a simulation model including at least a physical model configured to output an estimated polishing physical quantity including an estimated polishing rate of the workpiece, the arithmetic system being configured to input polishing conditions for the workpiece into the simulation model; output the estimated polishing physical quantity of the workpiece from the simulation model; and determine model parameters of the simulation model that bring the estimated polishing physical quantity closer to a measured polishing physical quantity of the workpiece.

In an embodiment, the physical model includes a polishing-rate model configured to calculate the estimated polishing rate of the workpiece, and a polishing-torque model configured to calculate an estimated value of torque generated due to a sliding resistance of the polishing pad.

In an embodiment, the polishing-torque model includes a head rotation torque model configured to calculate an estimated value of a polishing-head rotation torque for rotating the polishing head and the workpiece on the polishing pad about an axis of the polishing head, and a pad rotation torque model configured to calculate an estimated value of a polishing-pad rotation torque for rotating the polishing pad about an axis of the polishing pad.

In an embodiment, the chemical mechanical polishing system further comprises a dresser configured to dress the polishing surface, wherein the polishing-torque model includes a dresser rotation torque model configured to calculate an estimated value of a dresser rotation torque for rotating the dresser on the polishing pad about an axis of the dresser, and a dresser oscillation torque model configured to calculate an estimated value of the dresser oscillation torque around an oscillation axis required for the dresser to oscillate on the polishing pad.

In an embodiment, the simulation model further includes a mathematical model representing a deterioration of the polishing pad with a passage of a polishing time.

In an embodiment, the arithmetic system is configured to: input the polishing conditions to the simulation model having the determined model parameters to calculate an updated estimated polishing physical quantity; and evaluate a difference between the updated estimated polishing physical quantity and the measured polishing physical quantity.

In an embodiment, there is provided an arithmetic system for creating a simulation model for chemical mechanical polishing, comprising: a memory storing a program and the simulation model therein; a processor configured to perform operations according to instructions included in the program, wherein the simulation model includes at least a physical model configured to output an estimated polishing physical quantity including an estimated polishing rate of a workpiece when chemically mechanically polished, the arithmetic system being configured to input polishing conditions for the workpiece into the simulation model; output the estimated polishing physical quantity of the workpiece from the simulation model; and determine model parameters of the simulation model that bring the estimated polishing physical quantity closer to a measured polishing physical quantity of the workpiece.

In an embodiment, there is provided a method of producing a simulation model for chemical mechanical polishing, comprising: inputting polishing conditions for a workpiece into the simulation model, the simulation model including at least a physical model configured to output an estimated polishing physical quantity including an estimated polishing rate of the workpiece; outputting the estimated polishing physical quantity of the workpiece from the simulation model; polishing the workpiece using a polishing apparatus; and determining model parameters of the simulation model that bring the estimated polishing physical quantity closer to a measured polishing physical quantity of the workpiece, wherein the polishing apparatus includes: a polishing table configured to support a polishing pad having a polishing surface; a polishing head configured to press the workpiece against the polishing surface; and a slurry supply nozzle configured to supply slurry onto the polishing surface.

In an embodiment, the physical model includes a polishing-rate model configured to calculate the estimated polishing rate of the workpiece, and a polishing-torque model configured to calculate an estimated value of torque generated due to a sliding resistance of the polishing pad.

In an embodiment, the polishing-torque model includes a head rotation torque model configured to calculate an estimated value of a polishing-head rotation torque for rotating the polishing head and the workpiece on the polishing pad about an axis of the polishing head, and a pad rotation torque model configured to calculate an estimated value of a polishing-pad rotation torque for rotating the polishing pad about an axis of the polishing pad.

In an embodiment, the polishing apparatus further includes a dresser configured to dress the polishing surface, wherein the polishing-torque model includes a dresser rotation torque model configured to calculate an estimated value of a dresser rotation torque for rotating the dresser on the polishing pad about an axis of the dresser, and a dresser oscillation torque model configured to calculate an estimated value of the dresser oscillation torque around an oscillation axis required for the dresser to oscillate on the polishing pad.

In an embodiment, the simulation model further includes a mathematical model representing a deterioration of the polishing pad with a passage of a polishing time.

In an embodiment, the method further comprises: inputting the polishing conditions to the simulation model having the determined model parameters to calculate an updated estimated polishing physical quantity; and evaluating a difference between the updated estimated polishing physical quantity and the measured polishing physical quantity.

In an embodiment, there is provided a method of producing a simulation model for chemical mechanical polishing, comprising: inputting polishing conditions for a workpiece into the simulation model, the simulation model including at least a physical model configured to output an estimated polishing physical quantity including an estimated polishing rate of the workpiece; outputting the estimated polishing physical quantity of the workpiece from the simulation model; and determining model parameters of the simulation model that bring the estimated polishing physical quantity closer to a measured polishing physical quantity of the workpiece.

Advantageous Effects of Invention

The physical model included in the simulation model is a virtual chemical mechanical polishing system that imitates an actual polishing apparatus. The model parameters that construct the simulation model are identified based on a difference between the measured polishing physical quantity (e.g., a measured polishing rate, a measured machine torque, etc.) obtained from the actual polishing apparatus and the estimated polishing physical quantity (e.g., an estimated polishing rate, an estimated machine torque, etc.) obtained from the simulation model. More specifically, the model parameters for bringing the estimated polishing physical quantity closer to the measured polishing physical quantity are determined. Therefore, the simulation model can accurately calculate an estimated polishing rate of a workpiece. In particular, since the creation of the physical model does not require so-called big data, the simulation model can calculate the result more quickly than a model used in the machine learning.

FIG. 7 is a diagram explaining a position of a minute area on a workpiece;

DESCRIPTION OF EMBODIMENTS

Figure 1:
FIG. 1 is a schematic diagram showing an embodiment of a chemical mechanical polishing system.

Hereinafter, embodiments of the present invention will be described with reference to the drawings. FIG. 1 is a schematic diagram showing an embodiment of a chemical mechanical polishing system. As shown in FIG. 1, the chemical mechanical polishing system includes a polishing apparatus 1 configured to chemically mechanically polish a workpiece W. The polishing apparatus 1 includes a polishing table 5 configured to support a polishing pad 2 having a polishing surface 2a, a polishing head 7 configured to press the workpiece W (e.g., a wafer, a substrate, or a panel) against the polishing surface 2a, a slurry supply nozzle 8 configured to supply slurry containing abrasive grains onto the polishing surface 2a, and an operation controller 80 configured to control operations of the polishing apparatus 1. The polishing head 7 is configured to be able to hold the workpiece W on a lower surface of the polishing head 7.

The polishing apparatus 1 further includes a support shaft 14, a polishing-head oscillation arm 16 coupled to an upper end of the support shaft 14 and configured to oscillate the polishing head 7, a polishing-head shaft 18 rotatably supported by a free end of the polishing-head oscillation arm 16, and a polishing-head rotating motor 20 configured to rotate the polishing head 7 about its axis. The polishing-head rotating motor 20 is arranged in the polishing-head oscillation arm 16 and is coupled to the polishing-head shaft 18 via a torque transmission mechanism (not shown) composed of a belt, pulleys, etc. The polishing head 7 is coupled to a lower end of the polishing-head shaft 18. The polishing-head rotating motor 20 rotates the polishing-head shaft 18 via the torque transmission mechanism, and the polishing head 7 rotates together with the polishing-head shaft 18. In this way, the polishing head 7 is rotated about its axis by the polishing-head rotating motor 20 in a direction indicated by arrow.

The polishing apparatus 1 further includes a table rotating motor 21 configured to rotate the polishing pad 2 and the polishing table 5 about their axes. The table rotating motor 21 is arranged below the polishing table 5, and the polishing table 5 is coupled to the table rotating motor 21 via a table shaft 5a. The polishing table 5 and the polishing pad 2 are rotated by the table rotating motor 21 about the table shaft 5a in a direction indicated by arrow. The axes of the polishing pad 2 and the polishing table 5 coincide with the axis of the table shaft 5a. The polishing pad 2 is attached to an upper surface of the polishing table 5. An upper surface of the polishing pad 2 constitutes the polishing surface 2a for polishing the workpiece W, such as wafer.

The polishing-head shaft 18 is movable up and down relative to the polishing-head oscillation arm 16 by an elevating mechanism 24. This vertical movement of the polishing-head shaft 18 causes the polishing head 7 to move up and down relative to the polishing-head oscillation arm 16. A rotary joint 25 is attached to an upper end of the polishing-head shaft 18.

The polishing apparatus 1 further includes a polishing-head oscillation motor 22 configured to oscillate the polishing head 7 on the polishing surface 2a. The polishing-head oscillation motor 22 is coupled to the polishing-head oscillation arm 16. The polishing-head oscillation arm 16 is configured to be rotatable about the support shaft 14. The polishing-head oscillation motor 22 is configured to swing the polishing-head oscillation arm 16 clockwise and counterclockwise by a predetermined angle around the support shaft 14, so that the polishing head 7 oscillates on the polishing pad 2 while the polishing head 7 is pressing the workpiece W against the polishing surface 2a of the polishing pad 2.

In the present embodiment, the polishing-head oscillation motor 22 is mounted to the upper end of the support shaft 14, and is arranged so as to swing the polishing-head oscillation arm 16 without rotating the support shaft 14. In one embodiment, the polishing-head oscillation arm 16 may be fixed to the support shaft 14, and the polishing-head oscillation motor 22 may be coupled to the support shaft 14 so as to rotate the support shaft 14 together with the polishing-head oscillation arm 16.

The elevating mechanism 24 for elevating and lowering the polishing-head shaft 18 and the polishing head 7 includes a bearing 26 that rotatably supports the polishing-head shaft 18, a bridge 28 to which the bearing 26 is fixed, a ball screw mechanism 32 attached to the bridge 28, a support base 29 supported by support columns 30, and a servomotor 38 fixed to the support base 29. The support base 29 that supports the servomotor 38 is coupled to the polishing-head oscillation arm 16 via the support columns 30.

The ball screw mechanism 32 includes a screw shaft 32a coupled to the servomotor 38 and a nut 32b into which the screw shaft 32a is screwed. The nut 32b is fixed to the bridge 28. The polishing-head shaft 18 is movable up and down (movable in the vertical direction) together with the bridge 28. Therefore, when the servomotor 38 drives the ball screw mechanism 32, the bridge 28 moves up and down, thus causing the polishing-head shaft 18 and the polishing head 7 to move up and down.

Polishing of the workpiece W is performed as follows. While the polishing head 7 and the polishing table 5 are rotating, the slurry is supplied onto the polishing surface 2a of the polishing pad 2 from the slurry supply nozzle 8 provided above the polishing table 5. The polishing pad 2 rotates together with the polishing table 5 about the axis of the polishing pad 2. The polishing head 7 is lowered to a predetermined polishing position by the elevating mechanism 24. Further, the polishing head 7 presses the workpiece W against the polishing surface 2a of the polishing pad 2 at the polishing position. The workpiece W is placed in sliding contact with the polishing surface 2a of the polishing pad 2 in the presence of the slurry on the polishing surface 2a of the polishing pad 2. The surface of the workpiece W is polished by a combination of a chemical action of the slurry and a mechanical action of the abrasive grains contained in the slurry.

The polishing apparatus 1 includes a dresser 50 configured to dress the polishing surface 2a of the polishing pad 2, a dresser shaft 51 to which the dresser 50 is coupled, an air cylinder 53 as a dresser-pressing actuator mounted to an upper end of the dresser shaft 51, a dresser oscillation arm 55 that rotatably supports the dresser shaft 51, and a support shaft 58 to which the dresser oscillation arm 55 is fixed.

The dresser 50 has a lower surface that constitutes a dressing surface 50a. This dressing surface 50a is composed of abrasive grains (for example, diamond particles). The air cylinder 53 is arranged on a support base 57 supported by columns 56, and these columns 56 are fixed to the dresser oscillation arm 55. The air cylinder 53 is coupled to the dresser 50 via the dresser shaft 51. The air cylinder 53 is configured to vertically move the dresser shaft 51 and the dresser 50 together and press the dressing surface 50a of the dresser 50 against the polishing surface 2a of the polishing pad 2 with a predetermined force. Instead of the air cylinder 53, a combination with a servomotor and a ball screw mechanism may be used as the dresser-pressing actuator.

The polishing apparatus 1 further includes a dresser rotating motor 60 configured to rotate the dresser 50 about its axis. The dresser rotating motor 60 is arranged in the dresser oscillation arm 55, and is coupled to the dresser shaft 51 via a torque transmission mechanism (not shown) composed of a belt, pulleys, etc. The dresser 50 is coupled to a lower end of the dresser shaft 51. The dresser rotating motor 60 rotates the dresser shaft 51 via the torque transmission mechanism, and the dresser 50 is rotated together with the dresser shaft 51. In this way, the dresser 50 is rotated about the axis thereof by the dresser rotating motor 60 in a direction indicated by arrow.

The polishing apparatus 1 further includes a dresser oscillation motor 63 configured to oscillate the dresser 50 on the polishing surface 2a. The dresser oscillation motor 63 is coupled to the support shaft 58. The dresser oscillation arm 55 is configured to be rotatable together with the support shaft 58 about the support shaft 58. The dresser oscillation motor 63 is configured to swing the dresser oscillation arm 55 clockwise and counterclockwise by a predetermined angle around the support shaft 58, so that the dresser 50 oscillates on the polishing pad 2 in the radial direction of the polishing pad 2 while the dresser 50 is pressing the dressing surface 50a against the polishing surface 2a of the polishing pad 2.

In the present embodiment, the dresser oscillation arm 55 is fixed to the support shaft 58, and the dresser oscillation motor 63 is coupled to the support shaft 58 so as to rotate the support shaft 58 together with the dresser oscillation arm 55. In one embodiment, the dresser oscillation motor 63 may be mounted to the upper end of the support shaft 58 and may be arranged so as to swing the dresser oscillation arm 55 without rotating the support shaft 58.

Dressing of the polishing surface 2a of the polishing pad 2 is performed as follows. During polishing of the workpiece W, the dresser 50 is rotated about the dresser shaft 51, and the dressing surface 50a of the dresser 50 is pressed against the polishing surface 2a by the air cylinder 53. The dresser 50 is placed in sliding contact with the polishing surface 2a in the presence of the slurry on the polishing surface 2a. While the dresser 50 is in sliding contact with the polishing surface 2a, the dresser oscillation motor 63 swings the dresser oscillation arm 55 clockwise and counterclockwise about the support shaft 58 by a predetermined angle, so that the dresser 50 is moved in the radial direction of the polishing pad 2. In this way, the polishing pad 2 is scraped off by the dresser 50, and dressing (i.e., regeneration) of the polishing surface 2a is achieved.

In the present embodiment, the dressing of the polishing surface 2a is performed during the polishing of the workpiece W, while in one embodiment, the dressing of the polishing surface 2a may be performed after the polishing of the workpiece W. In this case, pure water may be supplied onto the polishing surface 2a instead of the slurry during dressing.

Figure 2:
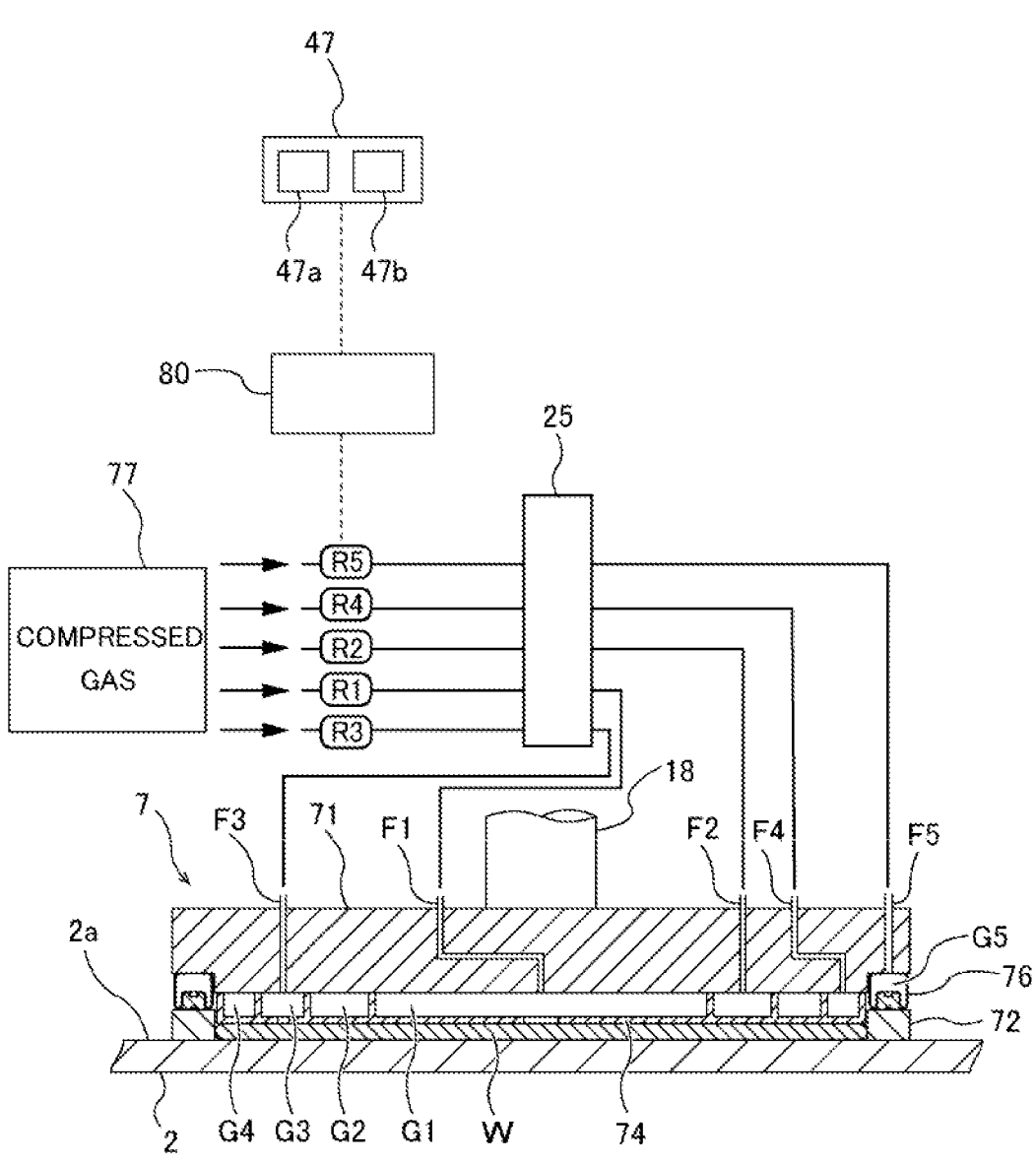
FIG. 2 is a cross-sectional diagram of a polishing head shown in FIG. 1.

FIG. 2 is a cross-sectional view of the polishing head 7 shown in FIG. 1. The polishing head 7 includes a carrier 71 fixed to the polishing-head shaft 18, and a retainer ring 72 arranged below the carrier 71. A flexible membrane (or an elastic membrane) 74, which is arranged to contact the workpiece W, is held on a lower portion of the carrier 71. Four pressure chambers G1, G2, G3 and G4 are formed between the membrane 74 and the carrier 71. The pressure chambers G1, G2, G3 and G4 are formed by the membrane 74 and the carrier 71. The central pressure chamber G1 is circular, and the other pressure chambers G2, G3, and G4 are annular. These pressure chambers G1, G2, G3 and G4 are concentrically arranged. In one embodiment, more than four pressure chambers may be provided, or less than four pressure chambers may be provided.

Compressed gas, such as compressed air, is supplied into the pressure chambers G1, G2, G3, and G4 by a gas supply source 77 via fluid passages F1, F2, F3, and F4, respectively. The workpiece W is pressed against the polishing surface 2a of the polishing pad 2 by the membrane 74. More specifically, pressures of the compressed gas in the pressure chambers G1, G2, G3 and G4 act on the workpiece W via the membrane 74 to press the workpiece W against the polishing surface 2a. The pressures in the pressure chambers G1, G2, G3 and G4 can be changed independently, so that polishing pressures on corresponding four regions of the workpiece W, namely a central portion, an inner intermediate portion, an outer intermediate portion, and a peripheral portion, can be regulated independently. The pressure chambers G1, G2, G3 and G4 communicate with a vacuum source (not shown) via the fluid passages F1, F2, F3 and F4.

An annular rolling diaphragm 76 is arranged between the carrier 71 and the retainer ring 72, and a pressure chamber G5 is formed inside the rolling diaphragm 76. The pressure chamber G5 communicates with the gas supply source 77 via a fluid passage F5. The gas supply source 77 supplies the compressed gas into the pressure chamber G5, and the compressed gas in the pressure chamber G5 presses the retainer ring 72 against the polishing surface 2a of the polishing pad 2.

The peripheral portion of the workpiece W and a lower surface (i.e., a workpiece pressing surface) of the membrane 74 are surrounded by the retainer ring 72. During polishing of the workpiece W, the retainer ring 72 presses the polishing surface 2a of the polishing pad 2 outside the workpiece W so as to prevent the workpiece W from coming off from the polishing head 7 during polishing of the workpiece W.

The fluid passages F1, F2, F3, F4, and F5 extend from the pressure chambers G1, G2, G3, G4, and G5 to the gas supply source 77 via the rotary joint 25. Pressure regulators R1, R2, R3, R4, and R5 are attached to the fluid passages F1, F2, F3, F4, and F5, respectively. The compressed gas from the gas supply source 77 is supplied into the pressure chambers G1 to G5 through the pressure regulators R1 to R5, the rotary joint 25, and the fluid passages F1 to F5.

The pressure regulators R1, R2, R3, R4, and R5 are configured to regulate the pressures in the pressure chambers G1, G2, G3, G4, and G5. The pressure regulators R1, R2, R3, R4 and R5 are coupled to the operation controller 80. The operation controller 80 is coupled to an arithmetic system 47. The fluid passages F1, F2, F3, F4, and F5 are further coupled to vent valves (not shown), so that the pressure chambers G1, G2, G3, G4, and G5 can be ventilated to the atmosphere.

The operation controller 80 is configured to generate target pressure values for the pressure chambers G1 to G5, respectively. The operation controller 80 sends the target pressure values to the pressure regulators R1 to R5, and the pressure regulators R1 to R5 operate such that the pressures in the pressure chambers G1 to G5 coincide with the corresponding target pressure values. Since the polishing head 7 having the plurality of pressure chambers G1, G2, G3, and G4 can independently press the corresponding regions of the surface of the workpiece W against the polishing pad 2 based on the progress of polishing, the polishing head 7 can polish a film of the workpiece W uniformly.

During the polishing of the workpiece W, the polishing head 7 is maintained at a reference height. The reference height of the polishing head 7 is a relative height of the entire polishing head 7 with respect to the polishing surface 2a of the polishing pad 2. The compressed gas is supplied to the pressure chambers G1, G2, G3, G4, and G5 with the polishing head 7 at the reference height. The membrane 74 forming the pressure chambers G1, G2, G3 and G4 presses the workpiece W against the polishing surface 2a of the polishing pad 2, and the rolling diaphragm 76 forming the pressure chamber G5 presses the retainer ring 72 against the polishing surface 2a of the polishing pad 2.

Referring back to FIG. 1, the chemical mechanical polishing system further includes an arithmetic system 47 having a simulation model for simulating the polishing of the workpiece W and calculating estimated polishing physical quantities of the workpiece W. The arithmetic system 47 is electrically coupled to the polishing apparatus 1. More specifically, the arithmetic system 47 is coupled to the operation controller 80. The simulation model represents a virtual polishing apparatus that imitates the above-discussed polishing apparatus 1 including the polishing table 5, the polishing head 7, and the dresser 50. The actual polishing apparatus 1 and the simulation model, which is the virtual polishing apparatus constructed in a virtual space, constitute a digital twin. A system that utilizes such a digital twin is a called cyber-physical system in which a simulation result is fed back to the real world so that optimum control is performed (for example, control is performed so that the workpiece can be polished to have a flatter surface).

When preset polishing conditions are input to the simulation model, the simulation model performs virtual chemical mechanical polishing of the workpiece W using the virtual polishing apparatus, and outputs estimated polishing physical quantities, such as an estimated polishing rate of the workpiece W. Examples of the polishing conditions include a rotation speed of the polishing table 5 [$min^{-1}$ or rad/s], a rotation speed of the polishing head 7 [$min^{-1}$ or rad/s], pressure [Pa] applied from the workpiece W to the polishing surface 2a of the polishing pad 2, pressure [Pa] applied from the retainer ring 72 to the polishing surface 2a of the polishing pad 2, a relative position between the polishing head 7 and the polishing pad 2, a rotation speed of the dresser 50 [$min^{-1}$ or rad/s], pressure [Pa] applied from the dresser 50 to the polishing surface 2a of the polishing pad 2, a relative position between the dresser 50 and the polishing pad 2, and a position and a flow rate of the slurry supplied. The polishing rate is defined as an amount of surface material of the workpiece W removed per unit time. The polishing rate may be referred to as a material removal rate.

The arithmetic system 47 includes a memory 47a in which programs and the simulation model are stored, and a processor 47b configured to perform arithmetic operations according to instructions included in the programs. The memory 47a includes a main memory, such as RAM, and an auxiliary memory, such as hard disk drive (HDD) or solid state drive (SSD). Examples of the processor 47b include a CPU (central processing unit) and a GPU (graphic processing unit). However, the specific configurations of the arithmetic system 47 are not limited to these examples.

The arithmetic system 47 is composed of at least one computer. The at least one computer may be one server or a plurality of servers. The arithmetic system 47 may be an edge server, a cloud server coupled to a communication network, such as the Internet or a local area network, or a fog server installed in a network. The arithmetic system 47 may be a plurality of servers coupled by a communication network, such as the Internet or a local area network. For example, the arithmetic system 47 may be a combination of an edge server and a cloud server.

The simulation model is composed of at least a physical model configured to output the estimated polishing physical quantities. The simulation model is stored in the memory 47a. The physical model includes at least a polishing-rate model and a polishing-torque model. The polishing-rate model is a physical model for calculating an estimated polishing rate, which is an example of the estimated polishing physical quantity. The polishing-torque model is a physical model for calculating an estimated value of torque required for each mechanical element of the polishing apparatus 1 due to a sliding resistance of the polishing pad 2. The estimated value of torque is also an example of the estimated polishing physical quantity as well as the estimated polishing rate. Specific examples of the torque include a polishing-head rotation torque for rotating the polishing head 7 and the workpiece W about the axis of the polishing head 7, a polishing-pad rotation torque for rotating the polishing pad 2 (or the polishing table 5) about its axis, a dresser rotation torque for rotating the dresser 50 about its axis, a dresser oscillation torque around an oscillation axis required to oscillate the dresser 50 on the polishing pad 2, and a head oscillation torque around an oscillation axis required to oscillate the polishing head 7 on the polishing pad 2.

The simulation model contains multiple model parameters. These model parameters include known model parameters determined by the polishing conditions (e.g., the polishing pressure, the rotation speed of the polishing head 7, the rotation speed of the polishing pad 2), and unknown model parameters, such as a coefficient of friction of the workpiece W. Once the unknown model parameters are determined, the estimated polishing physical quantities (e.g., the estimated polishing rate and the estimated values of the various torques) of the workpiece W can be output from the simulation model by inputting the polishing conditions into the simulation model.

Measured polishing physical quantities include an actual polishing rate of the workpiece W and measured values of various torques required in the polishing of the workpiece W. These measured polishing physical quantities can be determined from measurement data. The arithmetic system 47 is configured to identify or determine the unknown model parameters of the simulation model by using the measured polishing physical quantities, obtained by actual polishing, as identification parameters. Identification of the unknown model parameters is to bring the unknown model parameters closer to optimum values.

The programs stored in the memory 47a of the arithmetic system 47 include an identification program for identifying or determining the unknown model parameters. The arithmetic system 47 operates according to instructions included in the identification program, and identifies the model parameters of the simulation model for bringing the estimated polishing physical quantities of the workpiece closer to the measured polishing physical quantities of the workpiece. The measured polishing physical quantities of the workpiece include a measured polishing rate of the workpiece and measured values of the torques. The estimated polishing physical quantities of the workpiece include an estimated polishing rate of the workpiece and estimated values of the torques.

The polishing apparatus 1 polishes at least one workpiece under predetermined polishing conditions, and the arithmetic system 47 acquires the measured polishing physical quantities determined from the polishing of the workpiece and stores the measured polishing physical quantities in the memory 47a. The predetermined polishing conditions may be, for example, actual polishing conditions for the workpiece or may be preset polishing conditions for test polishing. The polishing conditions may be changed dynamically during polishing. In this case, improved identification accuracy may be achieved and an advanced basis function may be used. The measured polishing physical quantities include the measured polishing rate of the workpiece, and the measured values of the torques of the polishing head 7, the polishing pad 2 (or the polishing table 5), and the dresser 50 when the workpiece is being polished. The measured values of the torques may be values that directly indicate the torques, such as measurements of torque meters (not shown), or may be values that indirectly indicate the torques, such as values of torque currents supplied to the polishing-head rotating motor 20, the table rotating motor 21, and the dresser rotating motor 60, or may be torque estimated values calculated from these torque currents. In one example, the measured values of the torques may be values that indirectly estimate the polishing torques on a model basis from a mechanical model of the mechanical structure and in-process information of the motor currents and acceleration/deceleration physical quantities. The polishing-head rotating motor 20, the table rotating motor 21, and the dresser rotating motor 60 are controlled so as to rotate the polishing head 7, the polishing table 5, and the dresser 50 at predetermined constant speeds, respectively. Therefore, as the sliding resistances acting on the polishing head 7, the polishing pad 2, and the dresser 50 increase, the torque currents also increase.

Figure 3:
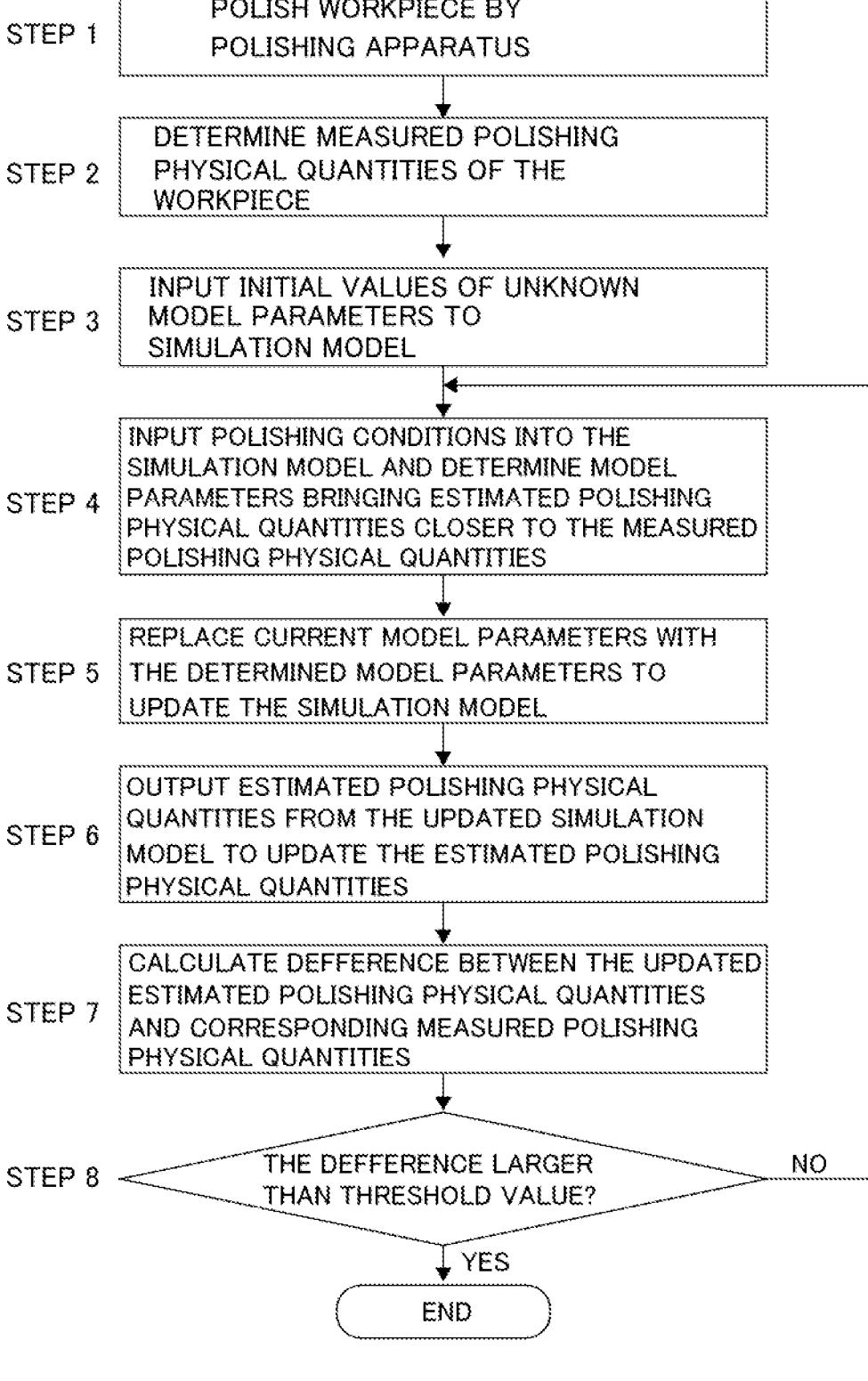
FIG. 3 is a flowchart explaining a method of identifying unknown model parameters of a simulation model.

FIG. 3 is a flowchart illustrating a method of identifying the unknown model parameters of the simulation model.

In step 1, the polishing apparatus 1 shown in FIG. 1 polishes at least one workpiece under the predetermined polishing conditions.

In step 2, the arithmetic system 47 determines the measured polishing physical quantities from the measurement data obtained from the actual polishing of the workpiece. More specifically, the arithmetic system 47 calculates the measured polishing rate of the workpiece, and obtains the measured values of the various torques generated while the workpiece is being polished. The measured polishing rate can be calculated by dividing a difference between an initial film thickness of the workpiece and a film thickness of the polished workpiece by a polishing time. The measured values of the various torques may be the torque currents supplied to the polishing-head rotating motor 20, the table rotating motor 21, and the dresser rotating motor 60. These measured polishing physical quantities are stored in the memory 47a.

In step 3, the arithmetic system 47 inputs initial values of the unknown model parameters stored in the memory 47a to the simulation model.

In step 4, the arithmetic system 47 inputs the polishing conditions for the workpiece into the simulation model, and determines the model parameters that bring the estimated polishing physical quantities of the workpiece closer to the measured polishing physical quantities obtained in the step 2. This step 4 is a process of identifying or determining the unknown model parameters capable of bringing the estimated polishing physical quantities closer to the measured polishing physical quantities.

In step 5, the arithmetic system 47 replaces the current model parameters of the simulation model with the model parameters determined in the step 4 to update the simulation model.

In step 6, the arithmetic system 47 inputs the polishing conditions used in the step 4 into the updated simulation model, and outputs the estimated polishing physical quantities from the simulation model to update the estimated polishing physical quantities.

In step 7, the arithmetic system 47 calculates a difference between the updated estimated polishing physical quantities and the corresponding measured polishing physical quantities.

In step 8, the arithmetic system 47 evaluates the above difference. The steps 5 to 8 are a process of evaluating the determined model parameters. If the difference is greater than or equal to a predetermined threshold value, the arithmetic system 47 repeats the steps 4 to 8. When the above difference is smaller than the threshold value, the arithmetic system 47 terminates the determining operations for the model parameters. In one embodiment, the arithmetic system 47 counts the number of repetitions from the step 4 to the step 8 and if the number of repetitions is equal to or greater than a predetermined value (or a calculation time for repeating the steps 4 to 8 is greater than or equal to a predetermined value), and/or if the above difference is less than the threshold value, the arithmetic system 47 terminates the determining operations for the model parameters.

The arithmetic system 47 determines the model parameters for bringing the estimated polishing physical quantities closer to the measured polishing physical quantities according to algorithms (e.g., least square method, steepest descent method, simplex method) included in the identification program stored in the memory 47a. The simulation model having the model parameters finally determined according to the flowchart shown in FIG. 3 is stored in the memory 47a.

Next, the simulation model will be described. As described above, the simulation model includes the polishing-rate model for calculating an estimated polishing rate of the workpiece W and the polishing-torque model for calculating an estimated value of torque generated due to the sliding resistance of the polishing pad 2.

The polishing-rate model is expressed, for example, based on Preston's law as follows.

$$\text{Polishing rate MMR}=k_p p|V|=\beta\,^W\mu p|V| \tag{1}$$

where $k_p$ is Preston's coefficient, p is pressure of the workpiece W applied to the polishing pad 2, V is relative velocity between the workpiece W and the polishing pad 2, $\beta$ is proportionality constant (or torque constant), and $^W\mu$ is coefficient of friction of the workpiece W.

The above equation (1) is set on the assumption that the Preston coefficient $k_p$ is proportional to the coefficient of friction $^W\mu$ of the workpiece W. In other words, it is assumed that the polishing rate MMR of the workpiece W correlates with the coefficient of friction $^W\mu$ of the workpiece W.

In the above equation (1), the proportionality constant $\beta$ and the coefficient of friction $^W\mu$ are unknown model parameters, while the pressure p and the relative velocity V are known model parameters given by the polishing conditions. Therefore, once the proportionality constant $\beta$ and the coefficient of friction $^W\mu$ are determined, the estimated value of the polishing rate, i.e., the estimated polishing rate, can be determined from the above equation (1).

Next, the polishing-torque model will be described. The polishing-torque model is a physical model for calculating an estimated value of mechanical torque required for the polishing apparatus during polishing of the workpiece W. During polishing of the workpiece W, sliding resistances act on the polishing surface 2a of the polishing pad 2. One of the sliding resistances is a sliding resistance generated between the polishing head 7 (including the workpiece W) and the polishing pad 2, and the other is a sliding resistance generated between the dresser 50 and the polishing pad 2. Depending on these sliding resistances, the torques required to rotate the polishing head 1, the polishing pad 2, and the dresser 50 at their respective set speeds change.

The polishing-torque model includes at least a head rotation torque model configured to calculate an estimated value of a polishing-head rotation torque for rotating the polishing head 7 and the workpiece W on the polishing pad 2 about the axis of the polishing head 7 (this axis corresponds to an axis of the polishing-head shaft 18), and a pad rotation torque model configured to calculate an estimated value of a polishing-pad rotation torque for rotating the polishing pad 2 about its axis (which corresponds to an axis of the table shaft 5a).

During polishing of the workpiece W, the workpiece W and the retainer ring 72 are pressed against the polishing pad 2 while the polishing head 7 and the workpiece W are rotating. The head rotation torque model is a physical model for calculating an estimated value of the torque required for rotating the polishing head 7 about its axis at a predetermined speed against both the friction between the retainer ring 72 and the polishing pad 2 and the friction between the workpiece W and the polishing pad 2.

In this embodiment, dressing of the polishing surface 2*a* of the polishing pad 2 is performed during polishing of the workpiece W. Therefore, during polishing of the workpiece W, the retainer ring 72 of the polishing head 7, the workpiece W, and the dresser 50 are in contact with the polishing pad 2. As a result, the polishing-pad rotation torque depends on the frictions of the retainer ring 72, the workpiece W, and the dresser 50 with respect to the polishing pad 2. The pad rotation torque model is a physical model for calculating an estimated value of the torque required to rotate the polishing pad 2 (i.e., the polishing table 5) at a predetermined speed against the friction between the retainer ring 72 and the polishing pad 2, the friction between the workpiece W and the polishing pad 2, and the friction between the dresser 50 and the polishing pad 2.

Figure 4:
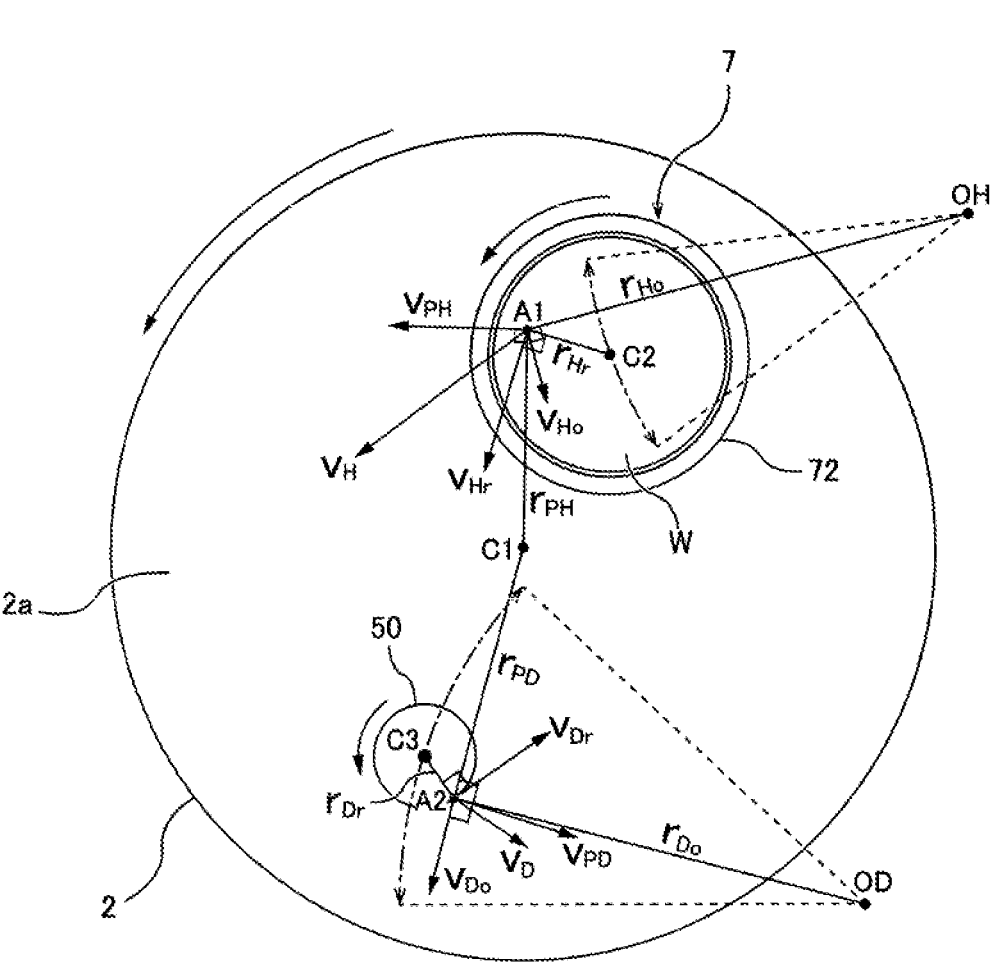
FIG. 4 is a schematic diagram showing velocity vectors on the polishing head, a workpiece, and a dresser on a polishing pad.

FIG. 4 is a schematic diagram showing velocity vectors on the polishing head 7, the workpiece W, and the dresser 50 on the polishing pad 2. Symbols shown in FIG. 4 are defined as follows.

Velocity vector in the rotating direction of the polishing pad 2 at a point A1 on the workpiece W or retainer ring 72: $V_{PH}$ Position vector from a center C1 of the polishing pad 2 to the point A1: $r_{PH}$ Position vector from a center C2 of the polishing head 7 to the point A1: $r_{Hr}$ Velocity vector in the rotating direction of the polishing head 7 at the point A1: $V_{Hr}$ Velocity vector in the oscillating direction of the polishing head 7 at the point A1: $V_{Ho}$ Composite velocity vector of the polishing head 7 at the point A1: $V_H = V_{Hr} + V_{Ho}$ Oscillation axis of the polishing head 7: OH (corresponds to the axis of the support shaft 14)

Position vector from the oscillation axis OH of the polishing head 7 to the point A1: $r_{Ho}$ Velocity vector in the rotating direction of the polishing pad 2 at a point A2 on the dresser 50: $V_{PD}$ Position vector from the center C1 of the polishing pad 2 to the point A2: $r_{PD}$ Position vector from a center C3 of the dresser 50 to the point A2: $r_{Dr}$ Velocity vector in the rotating direction of the dresser 50 at the point A2: $V_{Dr}$ Velocity vector in the oscillating direction of the dresser 50 at the point A2: $V_{Do}$ Composite velocity vector of the dresser 50 at the point A2: $V_D = V_{Dr} + V_{Do}$ Oscillation axis of the dresser 50: OD (corresponds to the axis of the support shaft 58)

Figure 5:
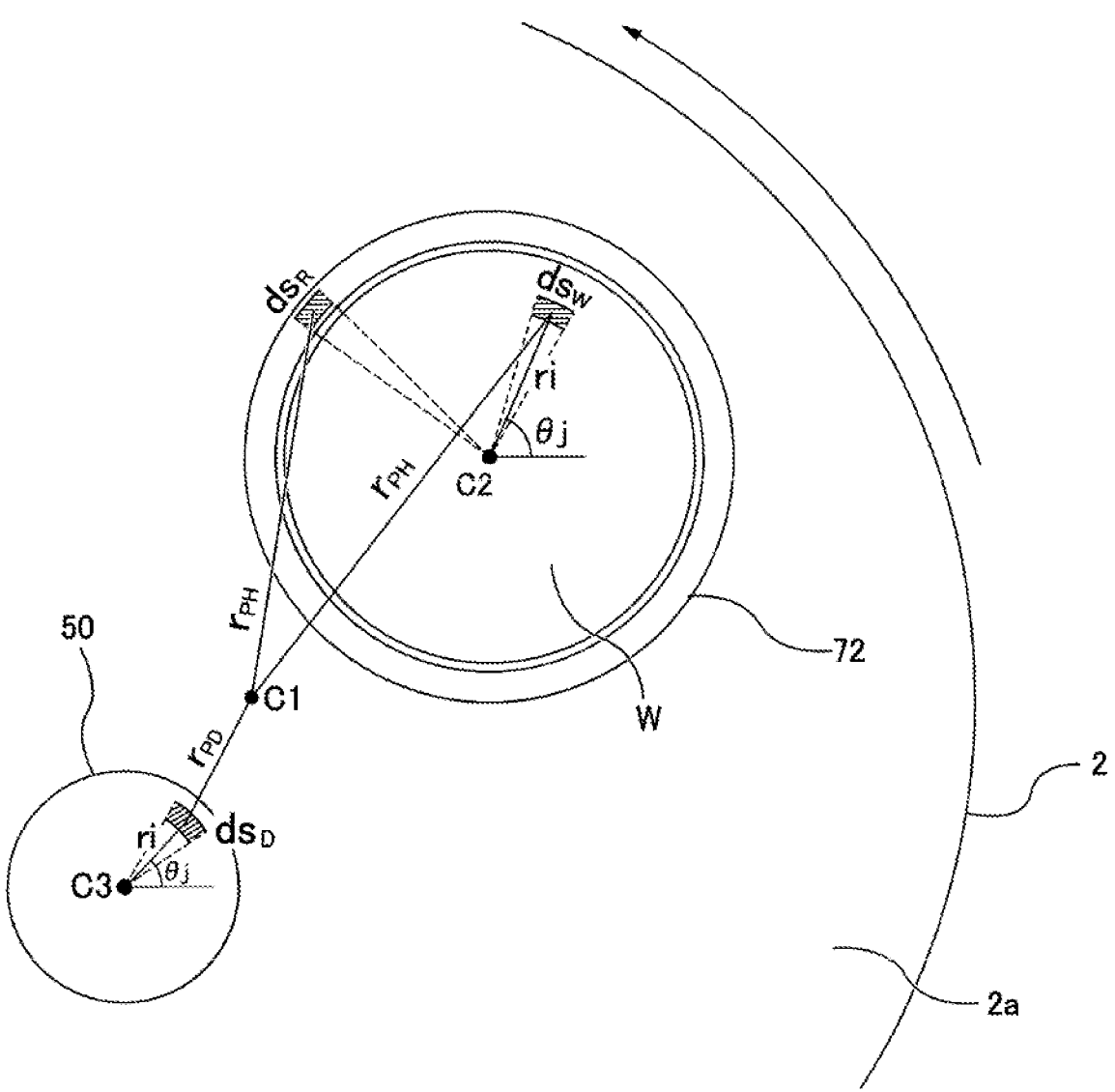
FIG. 5 is a schematic diagram explaining a pad rotation torque model.

Position vector from the oscillation axis OD of the dresser 50 to the point A2: $r_{Do}$ Relative velocity vector of the polishing head 7 with respect to the polishing pad 2 at the point A1: $V_{PH-H} = V_H - V_{PH}$ Unit vector of the relative velocity vector $V_{PH-H}$: $uV_{PH-H} = V_{PH-H} / |V_{PH-H}|$ Relative velocity vector of the polishing pad 2 with respect to the polishing head 7 at the point A1: $V_{H-PH} = V_{PH} - V_H$ Unit vector of the relative velocity vector $V_{H-PH}$: $uV_{H-PH} = V_{H-PH} / |V_{H-PH}|$ Relative velocity vector of the dresser 50 with respect to the polishing pad 2 at the point A2: $V_{PD-D} = V_D - V_{PD}$ Relative velocity vector $V_{PD-D}$ unit vector: $uV_{PD-D} = V_{PD-D} / |V_{PD-D}|$ Relative velocity vector of the polishing pad 2 with respect to the dresser 50 at the point A2: $V_{D-PD} = V_{PD} - V_D$ Unit vector of the relative velocity vector $V_{D-PD}$: $uV_{D-PD} = V_{D-PD} / |V_{D-PD}|$ Next, the pad rotation torque model will be described with reference to FIG. 5.

A sliding resistance $dF_{PW}$ (representing a vector) acting between a minute area $ds_W$ of the workpiece W and the polishing pad 2 is determined as follows.

$$\text{Sliding resistance } dF_{PW} = {}^W\mu\,{}^W p\ ds_W u V_{PH\text{-}H} \tag{2}$$

where ${}^W\mu$ is coefficient of friction of the workpiece W, ${}^W p$ is pressure of the workpiece W applied to the polishing pad 2, $ds_W$ is the minute area of the workpiece W, and $uV_{PH\text{-}H}$ is the unit vector of the relative velocity vector of the polishing head 7 with respect to the polishing pad 2.

A sliding resistance $dF_{PR}$ (representing a vector) acting between a minute area $ds_R$ of the retainer ring 72 and the polishing pad 2 is determined as follows.

$$\text{Sliding resistance } dF_{PR} = {}^R\mu\,{}^R p\ ds_R u V_{PH\text{-}H} \tag{3}$$

where ${}^R\mu$ is coefficient of friction of the retainer ring 72, ${}^R p$ is pressure of the retainer ring 72 applied to the polishing pad 2, $ds_R$ is the minute area of the retainer ring 72, and $uV_{PH\text{-}H}$ is the unit vector of the relative velocity vector of the polishing head 7 with respect to the polishing pad 2.

A sliding resistance $dF_{PD}$ (representing a vector) acting between a minute area $ds_D$ of the dresser 50 and the polishing pad 2 is determined as follows.

$$\text{Sliding resistance } dF_{PD} = {}^D\mu\,{}^D p\ ds_D u V_{PD\text{-}D} \tag{4}$$

where ${}^D\mu$ is coefficient of friction of the dresser 50, ${}^D p$ is pressure of the dresser 50 applied to the polishing pad 2, $ds_D$ is the minute area of the dresser 50, and $uV_{PD\text{-}D}$ is the unit vector of the relative velocity vector of the dresser 50 with respect to the polishing pad 2.

Minute torques acting on the center C1 of the polishing pad 2 due to the sliding resistances in the minute area $ds_W$ of the workpiece W, the minute area $ds_R$ of the retainer ring 72, and the minute area $ds_D$ of the dresser 50 are as follows.

$$\text{Minute torques } dN_{PW} = r_{PH} \times dF_{PW} \tag{5}$$

$$dN_{PR} = r_{PH} \times dF_{PR} \tag{6}$$

$$dN_{PD} = r_{PD} \times dF_{PD} \tag{7}$$

where the symbol × represents the cross product of the vectors.

When the position of the minute area $ds_W$ of the workpiece W, the position of the minute area $ds_R$ of the retainer ring 72, and the position of the minute area $ds_D$ of the dresser 50 are expressed in polar coordinates (ri, θj), the pad rotation torque model for calculating the estimated value of the polishing-pad rotation torque is given as follows.

$$\text{Polishing-pad rotation torque } {}^P N = \Sigma_i \Sigma_j dN_{PW} + \Sigma_i \Sigma_j dN_{PR} + \Sigma_i \Sigma_j dN_{PD} \tag{8}$$

In a case where the dressing of the polishing surface 2*a* of the polishing pad 2 is not performed during the polishing of the workpiece W, the term of $\Sigma_i \Sigma_j dN_{PD}$ in the above formula (8) is 0.

Next, the head rotation torque model for calculating an estimated value of the polishing-head rotation torque will be described.

The relative velocity vector of the polishing pad 2 with respect to the polishing head 7 is $V_{H-PH}=V_{PH}-V_H$, and the unit vector of the relative velocity vector $V_{H-PH}$ is $uV_{H-PH}=V_{H-PH}/|V_{H-PH}|$.

Assuming that the workpiece W rotates at the same rotation speed [min$^{-1}$] as the polishing head 7, the sliding resistances acting on the minute area $ds_W$ of the workpiece W and the minute area $ds_R$ of the retainer ring 72 are expressed as follows.

$$\text{Sliding resistances } dF_{HW}={}^W\mu\,{}^Wp\ ds_W uV_{H-PH} \qquad (9)$$

$$dF_{HR}={}^R\mu\,{}^Rp\ ds_R uV_{H-PH} \qquad (10)$$

Minute torques acting on the center C2 of the polishing head 7 due to the sliding resistances in the minute area $ds_W$ of the workpiece W and the minute area $ds_R$ of the retainer ring 72 are as follows.

$$\text{Minute torques } dN_{Hr\text{-}W}=r_{Hr}\times dF_{HW} \qquad (11)$$

$$dN_{Hr\text{-}R}=r_{Hr}\times dF_{HR} \qquad (12)$$

where $r_{Hr}$ is position vector from the center C2 of the polishing head 7 to the minute area $ds_W$ of the workpiece W, and is also position vector from the center C2 of the polishing head 7 to the minute area $ds_R$ of the retainer ring 72.

When the position of the minute area $ds_W$ of the workpiece W and the position of the minute area $ds_R$ of the retainer ring 72 are expressed in polar coordinates (ri, θj), the head rotation torque model for calculating an estimated value of the polishing-head rotation torque is given as follows.

$$\text{Polishing-head rotation torque } {}^H_rN=\Sigma_i\Sigma_j dN_{Hr\text{-}W}+$$
$$\Sigma_i\Sigma_j dN_{Hr\text{-}R} \qquad (13)$$

In the present embodiment, dressing of the polishing surface 2a of the polishing pad 2 is performed during polishing of the workpiece W. Therefore, as shown in the above equation (8), the pad rotation torque model includes the torque due to the sliding resistance of the dresser 50. In addition to the head rotation torque model and the pad rotation torque model, the polishing-torque model further includes a dresser rotation torque model configured to calculate an estimated value of the dresser rotation torque for rotating the dresser 50 on the polishing pad 2 about the axis of the dresser 50. The dresser rotation torque model is a physical model for calculating an estimated value of the torque required to rotate the dresser 50 at a predetermined speed against the friction between the dresser 50 and the polishing pad 2.

The dresser rotation torque model for calculating an estimated value of the dresser rotation torque is given in the same manner as the head rotation torque model as follows.

$$\text{Sliding resistance } dF_D={}^D\mu\,{}^Dp\ ds_D uV_{D-PD} \qquad (14)$$

$$\text{Minute torque } dN_{rD}=r_{Dr}\times dF_D \qquad (15)$$

$$\text{Dresser rotation torque } {}^D_rN=\Sigma_i\Sigma_j dN_{rD} \qquad (16)$$

where $^D\mu$ is coefficient of friction of the dresser 50, $^Dp$ is pressure of the dresser 50 applied to the polishing pad 2, $uV_{D-PD}$ is the unit vector of the relative velocity vector of the polishing pad 2 with respect to the dresser 50, and $r_{Dr}$ is the position vector from the center C3 of the dresser 50 to the minute area $ds_D$ of the dresser 50.

During dressing of the polishing pad 2, the dresser 50 oscillates on the polishing pad 2 in the radial direction of the polishing pad 2. The polishing-torque model further includes a dresser oscillation torque model for calculating an estimated value of a dresser oscillation torque around the oscillation axis OD of the dresser 50 required for the oscillation of the dresser 50.

The dresser oscillation torque model is expressed by the following equation (18).

$$\text{Minute torque } dN_{oD}=r_{Do}\times dF_D \qquad (17)$$

$$\text{Dresser oscillation torque } {}^D_oN=\Sigma_i\Sigma_j dN_{oD} \qquad (18)$$

where $r_{Do}$ is position vector from the oscillation axis OD of the dresser 50 (see FIG. 4) to the minute area $ds_D$ of the dresser 50.

In the present embodiment, the polishing head 7 oscillates on the polishing pad 2 during polishing of the workpiece W. The polishing-torque model further includes a head oscillation torque model for calculating an estimated value of a polishing-head oscillation torque around the oscillation axis OH of the polishing head 7 required for the oscillation of the polishing head 7.

The head oscillation torque model is expressed by the following equation (21).

$$\text{Minute torques } dN_{HoW}=r_{Ho}\times dF_{HW} \qquad (19)$$

$$dN_{HoR}=r_{Ho}\times dF_{HR} \qquad (20)$$

$$\text{Polishing-head oscillation torque } {}^H_oN=\Sigma_i\Sigma_j dN_{HoW}+$$
$$\Sigma_i\Sigma_j dN_{HoR} \qquad (21)$$

where $r_{Ho}$ is position vector from the oscillation axis OH (see FIG. 4) of the polishing head 7 to the minute area $ds_W$ of the workpiece W, and is also position vector from the oscillation axis OH to the minute area $ds_R$ of the retainer ring 72.

In the present embodiment, the polishing-torque model includes the above equations (8), (13), (16), (18), and (21). In a case where the dressing of the polishing pad 2 is not performed during polishing of the workpiece W, the polishing-torque model does not include the dresser rotation torque model represented by the equation (16) and the dresser oscillation torque model represented by the equation (18). In a case where the oscillation of the polishing head 7 is not performed during the polishing of the workpiece W, the polishing-torque model does not include the head oscillation torque model represented by the above equation (21).

The coefficients of friction $^W\mu$, $^R\mu$, and $^D\mu$ included in the above equations (1), (8), (13), (16), (18), and (21) constituting the simulation model are unknown model parameters. These unknown model parameters are identified or determined by the identification process described later.

Figure 6:
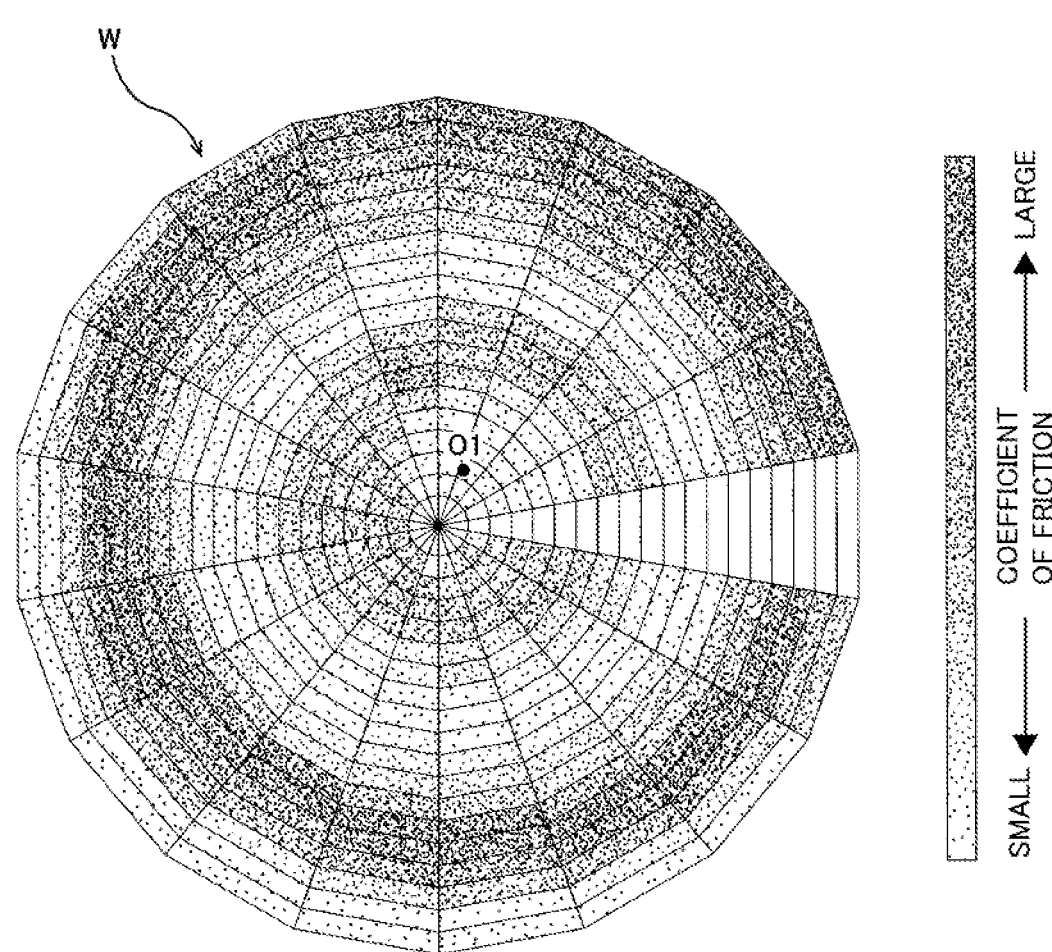
FIG. 6 is a schematic diagram showing a distribution of coefficients of friction of a workpiece.

The coefficient of friction $^W\mu$ of the workpiece W can vary depending on a distribution of the abrasive grains contained in the slurry supplied onto the polishing pad 2. FIG. 6 is a schematic diagram showing the distribution of the coefficient of friction $_H\mu$ of the workpiece W. The distribution of the coefficient of friction $^W\mu$ of the workpiece W can be determined by calculation. Specifically, a basis function representing the coefficient of friction of the workpiece W is defined, and the torque and the polishing rate are simultaneously identified and calculated. As a result, the distribution of the coefficient of friction $^W\mu$ of the workpiece W can be obtained as shown in FIG. 6.

Assuming that a polishing efficiency represented by the number of working abrasive grains on the workpiece W is proportional to the coefficient of friction $^W\mu$ of the workpiece W, the distribution of the coefficient of friction $^W\mu$ of the workpiece W can be replaced with the distribution of the working abrasive grains. The working abrasive grains are abrasive grains contained in the shiny that come into contact with the workpiece W and move relative to the workpiece W, thus contributing to the removal of the material of the workpiece W. As shown in FIG. 6, the coefficient of friction $^W\mu$ is large at the peripheral portion of the workpiece W and small at the central portion of the workpiece W. This is because during the polishing of the workpiece W, the slurry containing the abrasive grains is supplied onto the polishing pad 2 from the slurry supply nozzle 8 (see FIG. 1) and flows under the surface, to be polished, of the workpiece W from the peripheral portion of the workpiece W. Further, as shown in FIG. 6, a center O1 of the distribution of the coefficient of friction $^W\mu$ is slightly deviated from the center of the workpiece W. This is associated with the fact that the slurry supply nozzle 8 is located upstream of the polishing head 7 in the rotation direction of the polishing pad 2, as can be seen from FIG. 1.

Figure 7:
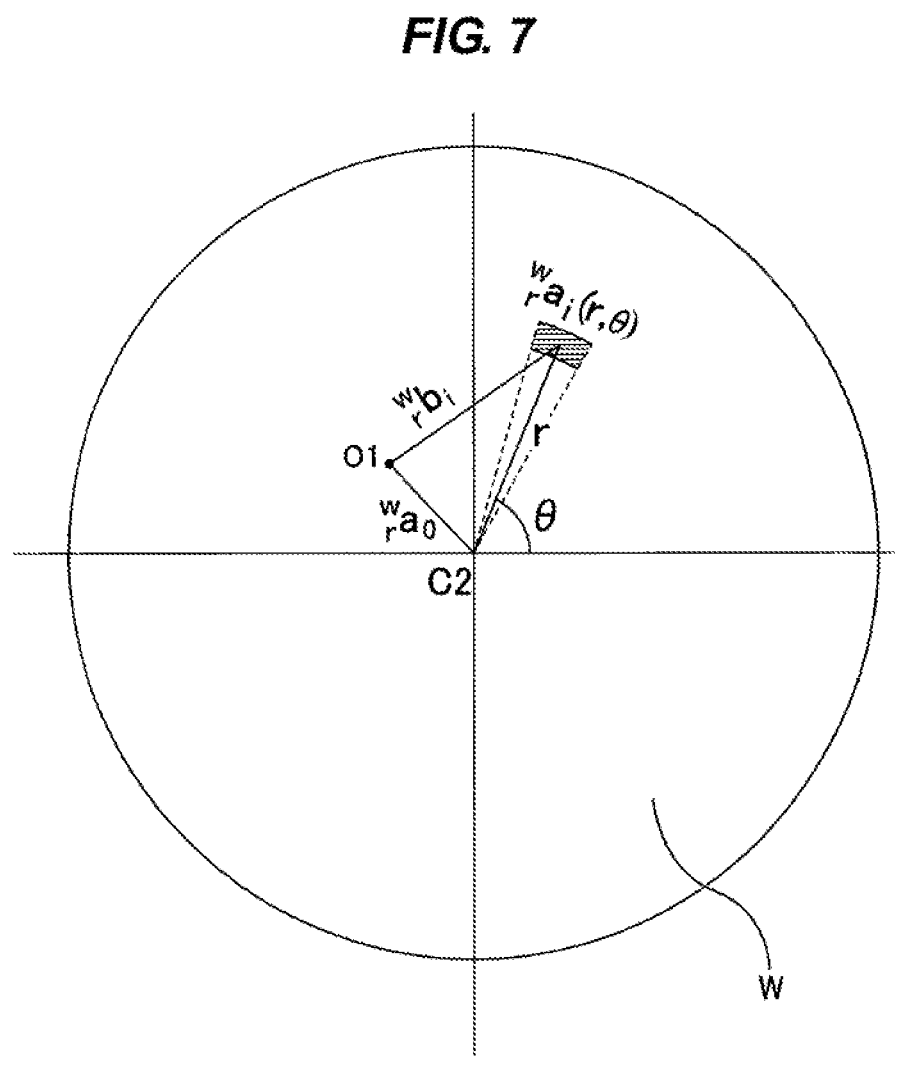

FIG. 7 is a diagram illustrating a position of a minute region on the workpiece W. In FIG. 7, $^W{}_ra_i(r, \theta)$ represents a position vector from the center C2 of the workpiece W to the minute region, $^W{}_ra_0$ represents a position vector of the center O1 of the distribution of the coefficient of friction $^W\mu$, and $^W{}_rb_i$ represents a distance from the center O1 of the distribution of the coefficient of friction $^W\mu$ to the minute region.

The distribution of the coefficient of friction $^W\mu$ of the workpiece W is given by the following equation.

[Math. 1]

$$^W\mu_i(r, \theta) = \sum_{j=0}^{N_j} \mu0_{jr}{}^wb_i^j = \sum_{j=0}^{N_j} \mu0_j|^w_ra_i(r, \theta) - ^w_ra_0|^j \qquad (22)$$

where $1 \leq r \leq Nr$, $1 \leq \theta \leq N_\theta$, $1 \leq i \leq N_\theta Nr$, $0 \leq j \leq Nj$. Nr represents the number of divisional elements in the radial direction, $N_\theta$ represents the number of divisional elements in the circumferential direction, $N_\theta Nr$ represents the total number of surface elements (elements), j represents a numerical value of an exponent of a polynomial, and Nj represents a maximum exponent of the polynomial. In FIG. 7 and the equation (22), r and $\theta$ are not physical quantities representing radius and angle, but are integers for specifying the number (or position) of each of the divisional elements distributed in the radial and circumferential directions shown in FIG. 6. The symbol $\mu0$ is the coefficient of friction at the center of the workpiece W.

The above equation (22) is a physical model representing the distribution of the coefficient of friction $^W\mu$ of the workpiece W. In the present embodiment, the simulation model further includes the physical model represented by the equation (22), in addition to the physical models represented by the above equations (1), (8), (13), (16), (18), and (21). The symbols $\mu0$ and $^W{}_ra_0$ in the equation (22) are unknown model parameters.

Figure 8:
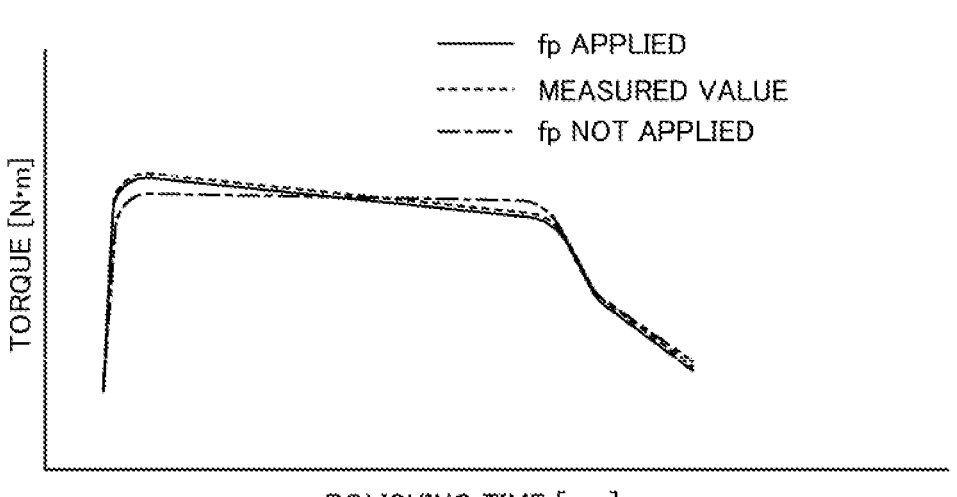
FIG. 8 is a graph showing a relationship between torque of the polishing pad and polishing time.

Next, an influence of deterioration of the polishing pad 2 with time on the coefficient of friction will be described. FIG. 8 is a graph showing a relationship between the torque of the polishing pad 2 and the polishing time. While the workpiece W is actually polished, the torque required to rotate the polishing pad 2 at a constant speed gradually decreases as shown by a dotted line in FIG. 8. Possible causes include a change in a surface roughness of the polishing pad 2, a change in a viscoelasticity of the polishing pad 2, and a change in a thickness of the polishing pad 2.

In contrast, the torque of the polishing pad 2 calculated by the physical model represented by the above equation (8) is constant regardless of the polishing time as shown by an alternate long and short dash line in FIG. 8. Thus, in order to reflect the actual torque change of the polishing pad 2 in the simulation model, the simulation model further includes a mathematical model expressing that the polishing pad 2 deteriorates with a passage of a polishing time. In this embodiment, the deterioration of the polishing pad 2 is expressed as a decrease in the coefficient of friction of the workpiece W.

The mathematical model representing the decrease in the coefficient of friction of the workpiece W, i.e., the deterioration of the polishing pad 2, is as follows.

$$\text{Coefficient of friction of the workpiece } ^W\mu = ^W$$
$$\mu_i f_p(t) = ^W\mu_i[(\alpha_0 - \alpha_1)\exp[-(t-t_0)/T] + \alpha_1] \qquad (23)$$

In equation (23), t is polishing time, $t_0$ is polishing start point in time, and T is time constant.

Figure 9:
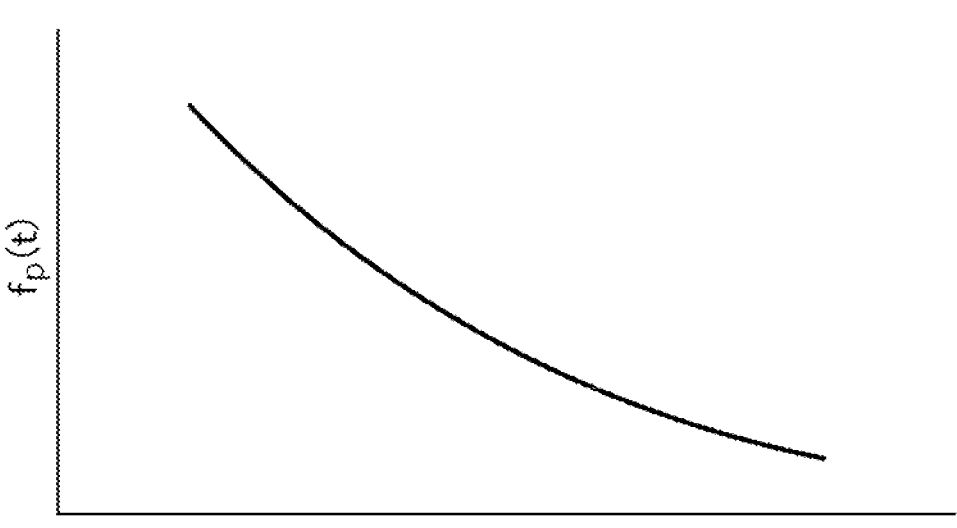
FIG. 9 is a graph showing a fitting function.

The mathematical model described above includes a fitting function $f_p(t)$ for reducing the coefficient of friction of the workpiece W with the polishing time. This fitting function $f_p(t)$ is an exponential function having the polishing time t as a variable. FIG. 9 is a graph showing the fitting function $f_p(t)$. Horizontal axis of FIG. 9 represents the polishing time t, and vertical axis represents the value of the fitting function $f_p(t)$ that changes according to the polishing time t. In the equation 18, $\alpha_0$, $\alpha_1$, $t_0$, T are unknown model parameters.

As discussed above, the simulation model of the present embodiment includes the physical models for calculating the estimated polishing rate of the workpiece W and the estimated torques of the polishing apparatus 1, and further includes the single mathematical model representing a decrease in the coefficient of friction of the workpiece W. As shown by a solid line in FIG. 8, the simulation model can calculate an estimated torque that changes in the same manner as the actual torque.

Next, a method of identifying (or determining) the above-mentioned unknown model parameters $^R\mu$, $^D\mu$, $\mu0$, $^W{}_ra_0$, $\beta$, $\alpha_0$, $\alpha_1$, $t_0$, and T will be described. The arithmetic system 47 is configured to identify or determine the unknown model parameters of the simulation model by using the measured polishing physical quantities, obtained by actual polishing, as identification parameters. The arithmetic system 47 operates according to the instructions included in the identification program stored in the memory 47a, and uses algorithms (e.g., least square method, steepest descent method, simplex method, etc.) to determine the model parameters that bring the estimated polishing physical quantities closer to the measured polishing physical quantities.

As described below, in the present embodiment, the arithmetic system 47 is configured to determine the model parameters $\mu0$, $^R\mu$, $^D\mu$ using the least square method, and determine the model parameters $^W{}_ra_0$, $\beta$, $\alpha_0$, $\alpha_1$, $t_0$, T using the simplex method. It is noted, however, that the present invention is not limited to the present embodiment, and the unknown model parameters may be determined using another algorithm, such as the steepest descent method. Alternatively, the unknown model parameters may be determined using only the least square method.

In one embodiment, an integrated calculation model using the least square method is as follows. In the following equation, upper left letter P represents the polishing pad 2, upper left letter H represents the polishing head 7, upper left letter D represents the dresser 50, lower left letter r represents the rotation, and lower left letter o represents the oscillation.

[Math. 2]

$$
\begin{bmatrix} ^{P}_{r}N \\ ^{H}_{r}N \\ ^{D}_{r}N \\ ^{H}_{o}N \\ ^{D}_{o}N \\ MRR \end{bmatrix}
=
\begin{bmatrix}
^{PW}_{r}C & ^{PR}_{r}C & ^{PD}_{r}C \\
^{W}_{r}C & ^{R}_{r}C & 0 \\
0 & 0 & ^{PW}_{r}C \\
^{W}_{o}C & ^{R}_{o}C & 0 \\
0 & 0 & ^{D}_{r}C \\
E & 0 & 0
\end{bmatrix}
\begin{bmatrix} \mu 0 \\ R\mu \\ D\mu \end{bmatrix}
\tag{24}
$$

On the left side of the above equation (24), the measured polishing physical quantities obtained from the actual polishing of the workpiece are input. The unknown model parameters are determined using the least square method as follows. Specifically, the equation (24) is expanded, a term of a parameter X to be identified is extracted, and an equation Y=AX is created. Further, the parameter X is identified by the least square method from an equation X=A*Y using a pseudo-inverse matrix A* of a matrix A. By repeating these operations, all unknown parameters can be identified.

The left side of the equation (24) is measurement data Yexp obtained from the actual polishing, and the right side is estimated data Ysim obtained from the simulation model. The right side Ysim is a product AX of the matrix A on the left side, which can be calculated only by the inputted polishing conditions, and the vector X of the unknown parameters related to the friction on the right side. The arithmetic system 47 can determine the unknown parameters X=A*Yexp using the least square method and using the pseudo-inverse matrix A* of the known matrix A.

In the coefficient matrix on the right side of the above equation (24), the following equation is substituted.

[Math. 3]

$$
^{PW}_{r}C_{kj} = \sum_{i=1}^{N_i} {}^{W}p_k\, {}^{W}ds_i^{PW}{}_rB_{ik}A_{ij}
\tag{25}
$$

$$
^{PR}_{r}C_{k} = \sum_{\theta=1}^{N_\theta} {}^{R}p_k^{\,R}ds_\theta^{PR}{}_rB_{\theta k}
\tag{26}
$$

$$
^{PD}_{r}C_{k} = \sum_{\theta=1}^{N_\theta} {}^{RD}p_k^{\,D}ds_\theta^{PD}{}_rB_{\theta k}
\tag{27}
$$

$$
A = [A_{ij}] =
\begin{bmatrix}
1 & \cdots & |{}^{W}_{r}r_1 - {}^{W}_{r}r0|^{j} & \cdots & |{}^{W}_{r}r_1 - {}^{W}_{r}r0|^{N_j} \\
\vdots & \ddots & & & \vdots \\
1 & & |{}^{W}_{r}r_i - {}^{W}_{r}r0|^{j} & & |{}^{W}_{r}r_i - {}^{W}_{r}r0|^{N_j} \\
\vdots & & & \ddots & \vdots \\
1 & \cdots & |{}^{W}_{r}r_{N_i} - {}^{W}_{r}r0|^{j} & \cdots & |{}^{W}_{r}r_{N_i} - {}^{W}_{r}r0|^{N_j}
\end{bmatrix}
\tag{28}
$$

$$
B_{ik} = r_{ik} \times \frac{v_{ik}}{|v_{ik}|}
\tag{29}
$$

In one embodiment, an error function model using the simplex method is as follows.

[Math. 4]

$$
\text{Error } ({}^{w}_{r}a_0, \beta, \alpha_0, \alpha_1, t_0, T) = \sum_{k=1}^{N_k}
\begin{bmatrix}
\|{}^{P}_{r}N_k^{exp} - {}^{P}_{r}N_k^{sim}\| \\
\|{}^{TR}_{r}N_k^{exp} - {}^{TR}_{r}N_k^{sim}\| \\
\|{}^{TR}_{o}N_k^{exp} - {}^{TR}_{o}N_k^{sim}\| \\
\|MRR_k^{exp} - MRR_k^{sim}\|
\end{bmatrix}^{T}
\begin{bmatrix} w_1 \\ w_2 \\ w_3 \\ w_l \end{bmatrix}
\tag{30}
$$

In the above equation (30), numerical values with subscript exp represent the measured values of the torques and the polishing rate. Numerical values with subscript sim are estimated values obtained from the simulation model. Symbols $w_1$, $w_2$, $w_3$, $w_4$ represent weights for estimation errors of the respective physical quantities.

The arithmetic system 47 operates according to the identification program to identify the above-described unknown model parameters. The arithmetic system 47 replaces the current model parameters of the simulation model with the determined model parameters. The arithmetic system 47 inputs the polishing conditions for the workpiece into the simulation model containing the determined model parameters, and calculates the estimated polishing physical quantities.

Further, the arithmetic system 47 calculates a difference between the measured polishing physical quantities that have been input into the equation (24) and the estimated polishing physical quantities, and determines whether or not this difference is smaller than a predetermined threshold value. If the difference is greater than or equal to the threshold value, the arithmetic system 47 performs the above-discussed identification again using measured polishing physical quantities of another workpiece. If the difference is less than the threshold value, the arithmetic system 47 calculates estimated polishing physical quantities of another workpiece using the simulation model containing the determined model parameters. Specifically, the arithmetic system 47 inputs polishing conditions for a workpiece (e.g., a wafer), which has not been polished yet, into the simulation model, and can accurately calculate an estimated polishing rate of that workpiece using the simulation model.

The arithmetic system 47 transmits the estimated polishing rate to the operation controller 80 shown in FIG. 1. The operation controller 80 can estimate a polishing end point of the workpiece being polished based on the estimated polishing rate. Further, the operation controller 80 may create a distribution of estimated polishing rates of the workpiece during polishing of the workpiece, and may control polishing pressures on the workpiece being polished (i.e., pressures applied from the polishing head 7 to the workpiece) based on the distribution of the estimated polishing rates.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention relates to a chemical mechanical polishing system for polishing a surface of a workpieces, such as wafer, substrate, or panel, and particularly relates to a cyber-physical system that optimizes a simulation model for chemical mechanical polishing based on actual measurement data of chemical mechanical polishing.

| Reference Signs List | |
| --- | --- |
| 1 | polishing apparatus |
| 2 | polishing pad |
| 5 | polishing table |
| 5a | table shaft |
| 7 | polishing head |
| 8 | slurry supply nozzle |

-continued

| Reference Signs List | |
| --- | --- |
| 14 | support shaft |
| 16 | polishing-head oscillation arm |
| 18 | polishing-head shaft |
| 20 | polishing-head rotating motor |
| 21 | table rotating motor |
| 22 | polishing-head oscillation motor |
| 24 | elevating mechanism |
| 25 | rotary joint |
| 26 | bearing |
| 28 | bridge |
| 29 | support base |
| 30 | column |
| 32 | ball-screw mechanism |
| 32a | screw shaft |
| 32b | nut |
| 38 | servomotor |
| 47 | arithmetic system |
| 47a | memory |
| 47b | processor |
| 50 | dresser |
| 50a | dressing surface |
| 51 | dresser shaft |
| 53 | air cylinder |
| 55 | dresser oscillation arm |
| 56 | column |
| 57 | support base |
| 58 | support shaft |
| 60 | dresser-rotating motor |
| 63 | dresser-oscillation motor |
| 71 | carrier |
| 72 | retainer ring |
| 74 | membrane (elastic membrane) |
| 76 | rolling diaphragm |
| 77 | gas supply source |
| 80 | operation controller |
| W | workpiece |
| G1, G2, G3, G4, G5 | pressure chamber |
| F1, F2, F3, F4, F5 | fluid passage |
| R1, R2, R3, R4, R5 | pressure regulator |

The invention claimed is:

1. A chemical mechanical polishing system comprising:
a polishing table configured to support a polishing pad having a polishing surface;
a polishing head configured to press a workpiece against the polishing surface;
a slurry supply nozzle configured to supply slurry onto the polishing surface; and
a computing system and a memory coupled thereto and storing a simulation model, the computing system communicatively coupled to the chemical mechanical polishing system, the computing system configured to:
cause the simulation model to instantiate at least a physical model configured to output an estimated polishing physical quantity including an estimated polishing rate of the workpiece, wherein the physical model includes a polishing-rate model configured to calculate the estimated polishing rate of the workpiece, and a polishing-torque model configured to calculate an estimated value of torque generated due to a sliding resistance of the polishing pad, and wherein the polishing-torque model includes a head rotation torque model configured to calculate an estimated value of a polishing-head rotation torque for rotating the polishing head and the workpiece on the polishing pad about an axis of the polishing head, and a pad rotation torque model configured to calculate an estimated value of a polishing-pad rotation torque for rotating the polishing pad about an axis of the polishing pad;
input polishing conditions for the workpiece into the simulation model;
output the estimated polishing physical quantity of the workpiece from the simulation model;
determine model parameters of the simulation model that bring the estimated polishing physical quantity closer to a measured polishing physical quantity of the workpiece; and
update at least one polishing control parameter of the chemical mechanical polishing system during polishing based on polishing process parameters and model output from the simulation model.

2. The chemical mechanical polishing system according to claim 1, further comprising a dresser configured to dress the polishing surface,
wherein the polishing-torque model includes a dresser rotation torque model configured to calculate an estimated value of a dresser rotation torque for rotating the dresser on the polishing pad about an axis of the dresser, and a dresser oscillation torque model configured to calculate an estimated value of the dresser oscillation torque around an oscillation axis required for the dresser to oscillate on the polishing pad.

3. The chemical mechanical polishing system according to claim 1, wherein the simulation model further includes a mathematical model representing a deterioration of the polishing pad with a passage of a polishing time.

4. The chemical mechanical polishing system according to claim 1, wherein the arithmetic system is configured to:
input the polishing conditions to the simulation model having the determined model parameters to calculate an updated estimated polishing physical quantity; and
evaluate a difference between the updated estimated polishing physical quantity and the measured polishing physical quantity.

* * * * *